(12) United States Patent
Budak et al.

(10) Patent No.: US 6,930,533 B2
(45) Date of Patent: Aug. 16, 2005

(54) METHOD AND APPARATUS FOR REDUCING CHARGE INJECTION IN A FET SWITCH

(75) Inventors: Sylvia Jane Budak, Windsor, CO (US); Christopher Judd Kemp, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/759,715

(22) Filed: Jan. 16, 2004

(65) Prior Publication Data

US 2005/0156657 A1 Jul. 21, 2005

(51) Int. Cl.[7] .............................................. H03K 17/16
(52) U.S. Cl. ....................................... 327/379; 327/391
(58) Field of Search ................................. 327/365, 379, 327/387, 389, 391–396, 401, 403, 404, 419, 427, 434

(56) References Cited

U.S. PATENT DOCUMENTS 5,111,072 A * 5/1992 Seidel .......................... 327/94

* cited by examiner

*Primary Examiner*—Kenneth B. Wells

(57) ABSTRACT

A method and apparatus for reducing charge injection in a FET switch. The switch includes a switch FET and two compensating FETs coupled to an input node. Gate drive signals for the two compensating FETs are generated by a gate drive circuit dependent upon the analog input signal and gate drive signal to the switch FET.

28 Claims, 4 Drawing Sheets

METHOD AND APPARATUS FOR REDUCING CHARGE INJECTION IN A FET SWITCH

FIELD OF THE INVENTION

This invention relates generally to the field of electrical switching. More particularly, this invention relates to a method and apparatus for reducing charge injection in a Field-Effect Transistor (FET) switch.

BACKGROUND

Field-Effect Transistor (FET) switches often introduce undesired voltage transients. For example, an N-channel, enhancement mode, Metal-oxide Semiconductor Field-Effect Transistor (MOSFET) switch is turned on by applying a gate drive signal to the gate of the FET. The gate drive signal makes a voltage transition from a supply level to a level above the analog signal to be switched. When the FET switch turns off, the opposite transition is made. In either case, part of the drive signal transition occurs while the switch FET is on, and part while the switch FET is off. For the 'off' part of the transition, the gate-to-drain capacitance of the FET couples into the input node and injects charge into the input, causing a voltage transient. On the other hand, for the 'on' part of the drive signal transition, the sum of the gate-to-drain, gate-to-source and gate-to-channel capacitances of the FET couples into the input node and injects charge into the input, causing a voltage transient.

One approach to reducing or eliminating the charge injection is to use a compensating FET and a capacitor. In this approach, the gate drive voltage of the compensation FET and/or capacitor is equal in magnitude to that of the switch FET but opposite in direction. The length of time the FETs are on varies with the input signal level and therefore changes the total amount of charge transfer. Consequently, this compensation technique will be less effective for some voltages than others. Another approach uses a programmable digital-to-analog converter (DAC) in an auto-calibration loop. A zero voltage level is applied to the high impedance input of the DAC. Measurements are then made using the analog-to-digital converter (ADC) of a digital multi-meter while the switch is toggled on and off. A programmable capacitor is adjusted until the reading is zero. This technique is expensive, due to external components, and requires a calibration algorithm. Additionally, the speed of compensation is limited, so high frequency injection is not well compensated.

OVERVIEW OF CERTAIN EMBODIMENTS

The present invention relates generally to the compensation of charge injection in FET switches. Objects and features of the invention will become apparent to those of ordinary skill in the art upon consideration of the following detailed description of the invention.

In one embodiment of the invention a switch includes a switch FET and two compensating FETs coupled to an input node. Gate drive signals for the two compensating FETs are generated by a gate drive circuit dependent upon the analog input signal and gate drive signal to the switch FET.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
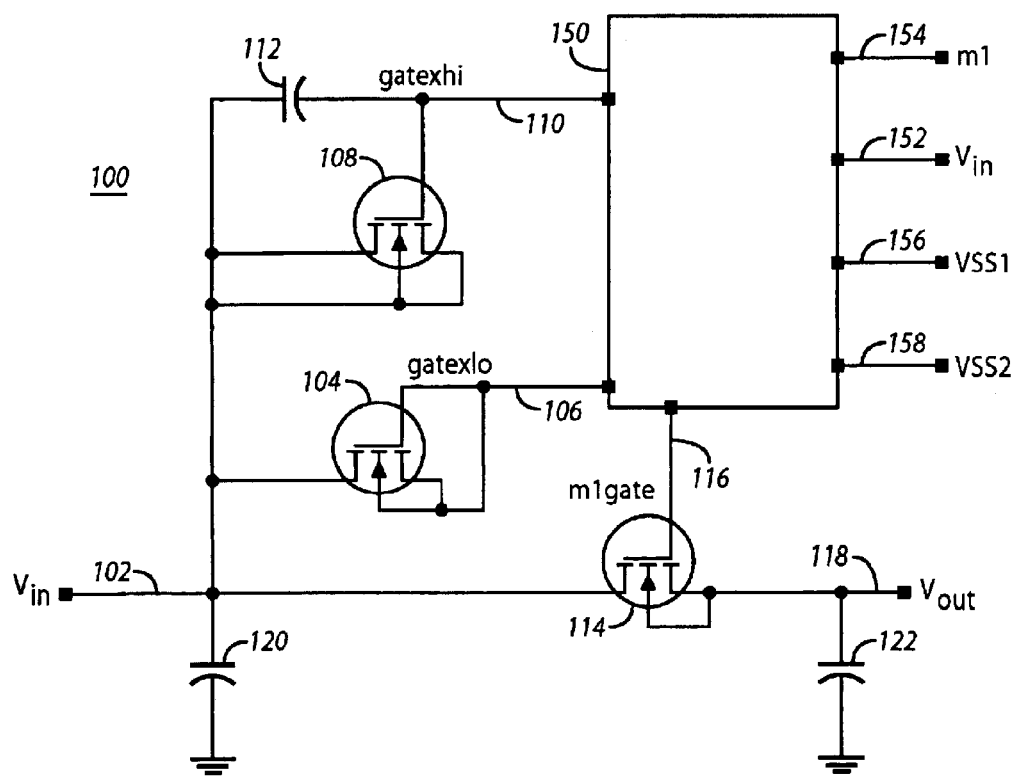
FIG. 1 is a schematic diagram of a charge compensation circuit in accordance with certain embodiments of the invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and describe. In the description below, like reference numerals are used to describe the same, similar or corresponding parts in the several views of the drawings.

FIG. 1 is a simplified schematic diagram of FET switch 100 incorporating an exemplary charge compensation circuit. Referring to FIG. 1, the signal to be switched is applied to input node 102 and denoted as Vin. The switch 100 employs two separate compensation circuits that act as "dummy capacitors" and are used to minimize charge injection into the input node 102. In this embodiment, the first compensation circuit or dummy capacitor comprises a FET 104. The drive for the first dummy capacitor is provided on the line 106 by a gate drive circuit 150 described below with reference to FIG. 5. Referring to FIG. 1, the gate drive signal for FET 104 is denoted by gatexlo. The drain of the FET 104 is coupled to the input node 102. The FET 108 provides the second dummy capacitor. The drain, channel and source of the FET 108 are all coupled to the input node 102. The drive for the FET 108 is provided on the line 110 by the gate driver circuit 150. The gate drive signal for FET 108 is denoted by gatexhi. An optional capacitor 112, which may be a poly/metal1/metal2 capacitor of variable capacitance, for example, is included to allow for 'fine tuning' of the capacitance provided by the dummy capacitors. The switching function itself is provided by the FET 114. The gate drive for the FET 114 is provided by the gate drive signal 116, and is denoted by the signal mlgate. The 'x' designation in the signals gatexhi and gatexlo signifies that these signals move opposite to the gate drive signal mlgate of the switch FET 114. That is, when the signal mlgate is rising, the signals gatexhi and gatexlo are falling and vice versa. The 'hi' and 'lo' designations indicate the part of the mlgate signal transition for which the gatexhi and gatexlo signals are being used to balance the charge injection, as will be explained below. Capacitors 120 and 122 represent stray capacitance and circuit capacitance on the Vin node 102 and Vout node 118, respectively.

In one embodiment, the FETs 104, 108 and 114 are of the same design to allow for accurate capacitance matching and tracking. The FETs may be Metal-Oxide Semiconductor Field-Effect Transistors (MOSFETs) or Junction Field-Effect Transistors (JFETs), or similar gate-controlled devices.

It will be apparent to those of ordinary skill in the art, that any of the FETs 104, 108 and 114 may, in practice, be an assembly of devices constituting a switch. For example, the FET may be a pair of back-to-back DMOS devices, a pair of MOSFET devices, or a CMOS device made of an NMOS device in parallel with a PMOS device. In the sequel the term "FET" will be taken to include a combination of devices forming a switch.

The operation of the circuit in FIG. 1 is now described for an exemplary embodiment. When the switch FET 114 turns on, the signal mlgate makes a voltage transition from a negative supply level VSS2 to approximately 10 V above the analog signal to be switched (Vin). The switch is turned on when the gate signal is at a switching voltage level Vs=Vin+Vth, where Vth is a threshold voltage level. When the switch FET 114 turns off, the opposite transition is made. In either case, part of the mlgate transition occurs while the switch FET is on, and part while the switch FET is off. For the 'off' part of the transition, only the gate-to-drain capacitance of the FET 114 couples into the input node Vin and causes a voltage transient. On the other hand, for the 'on' part of the mlgate transition, the sum of the gate-to-drain, gate-to-source and gate-to-channel capacitances of the FET 114 couples gate voltage changes into the input node Vin and causes a voltage transient. If a single charge balancing capacitor is used, and it is driven between the same voltages as mlgate (but in the opposite direction), optimal charge injection compensation will occur only for one value of the input signal level. However, good performance is achieved over the entire range of input signal levels if charge injection compensation is performed separately for the two distinct parts of the mlgate voltage transition.

In the switch circuit, the dummy capacitance driven by the signal gatexlo compensates for the switch FET charge injection for the 'off' part of the mlgate signal transition, whereas the dummy capacitance driven by the signal gatexhi compensates for the switch FET charge injection for the 'on' part of the mlgate signal transition. As the signal mlgate rises (switch turning on), the gatexlo falls from the switching level Vs to the level VSS2, and gatexhi falls from the turn-on level (Vbias volts above the switching level, or approximately 10 V above the input signal level) to the switching level. This equalizes the compensation charge, and the charge injected by the switch FET, for all levels of the input signal.

The gate control signals gatexlo, gatexhi and mlgate are generated by gate drive circuit 150. The drive circuit 150 receives the analog input signal Vin at input 152, a digital (logic) switching signal ml at input 154, and voltage supply signals VSS1 and VSS2 at input 156 and 158, respectively. An exemplary embodiment of the gate drive circuit 150 is described below with reference to FIG. 5.

Figure 2:
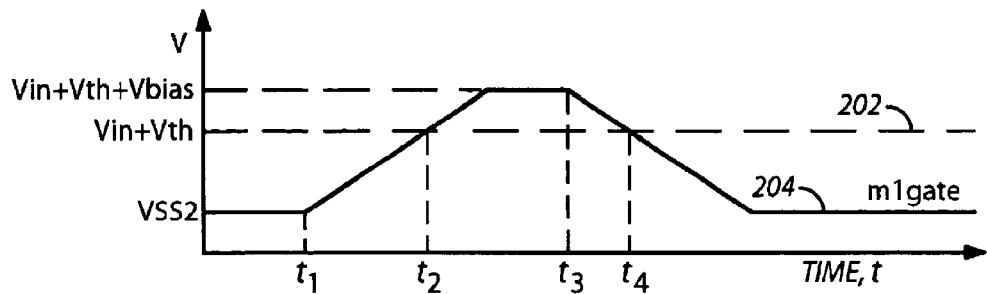
FIG. 2 is a diagram depicting a switch FET gate drive signal in a charge compensation circuit in accordance with certain embodiments of the invention.
Figure 3:
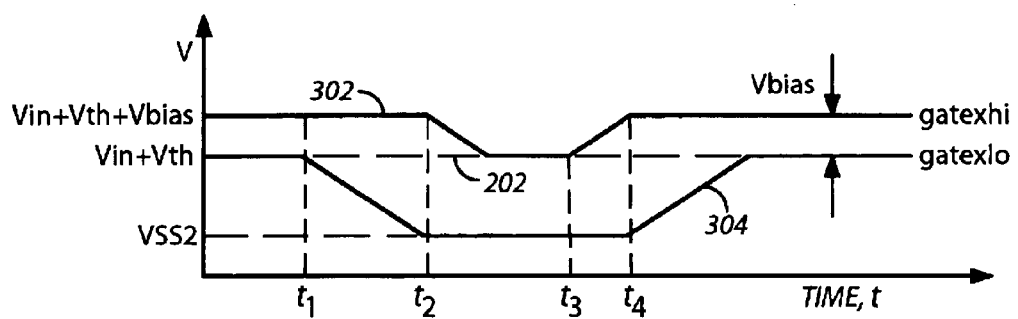
FIG. 3 is a diagram depicting further gate drive signals in a charge compensation circuit in accordance with certain embodiments of the invention.

The gatexlo and gatexhi signals, in addition to transitioning between the correct voltage levels, are also timed correctly to properly balance the injected charge. The relative timing of the signals is shown in FIG. 2 and FIG. 3. The figures show the voltage V of the gate drive signals as a function of time, t when the switch is turned on and off. Referring to FIG. 2, the switch turn-on is initiated at time $t_1$ when the digital signal ml (154 in FIG. 1) goes high. The mlgate signal 204 that controls the switch FET begins to ramp upwards. At time $t_2$ the mlgate signal 204 rises to the level 202 of the switching voltage, Vs=Vin+Vth, such that the voltage Vgs from the FET gate to its source is equal to Vth and the device just turns on. The switch turn-off is initiated at time $t_3$ when the digital signal ml (154 in FIG. 1) goes low. The mlgate signal 204 begins to ramp downwards. At time $t_4$ the mlgate signal 204 falls below the level 202 of the switching voltage Vs, such that Vgs<Vth and the device turns off.

Corresponding gatexlo and gatexhi signals are shown in FIG. 3. The gate driver circuit is designed such that, when the mlgate signal starts to rise at time $t_1$, the gatexlo signal 304 falls immediately, as shown in FIG. 3, but the gatexhi signal 302 does not fall until mlgate is above the switching voltage level at time $t_2$. When the mlgate signal starts to fall at time $t_3$, the gatexhi signal 302 rises immediately to a maximum level Vbias volts above the switching level Vs, but the gatexlo 304 does not rise until mlgate is below the switching voltage level at time $t_4$.

In one embodiment, the FETs are of the same type. In this embodiment the gate drive signals are given by:

$$gatexhi=Vs+Vbias+cl.(Vs-mlgate)$$

$$gatexlo=(1-cl).(Vs-mlgate)+VSS2$$

where $$cl = \begin{cases} 1 & \text{if } mlgate > Vs \\ 0 & \text{otherwise} \end{cases}.$$

The net voltage change of gatexhi, gatexlo and mlgate is zero and so the net charge injection will be zero.

Figure 4:
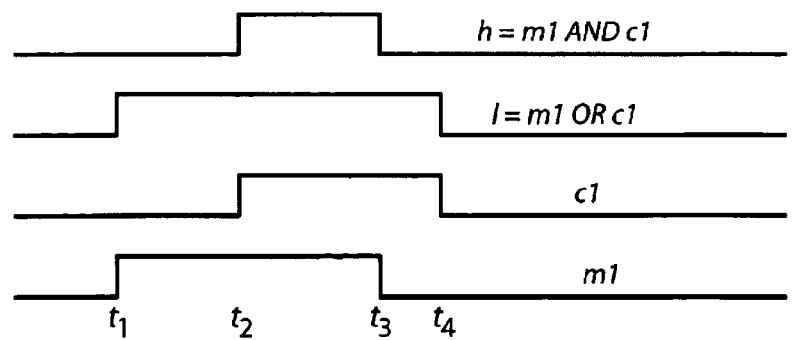
FIG. 4 is a timing diagram depicting logic signals in a charge compensation circuit in accordance with certain embodiments of the invention.

A signal indicating if the mlgate signal is above or below the switching level Vs may be obtained by passing the mlgate signal and a signal at the switching voltage level to a comparator. The output of the comparator is denoted by the logic signal cl. FIG. 4 is a timing diagram showing the comparator output cl and a digital (logic) switch signal ml used to activate the FET switch. The assertion of the digital switch signal ml at $t_1$ (a signal is asserted when it takes the logic value 'true', which is the value 1 for positive logic, and is de-asserted when it takes the value 'false') causes the mlgate signal to start rising. The de-assertion of the digital switch signal ml at $t_3$ causes the mlgate signal to start falling. The comparator output cl is asserted when the mlgate signal is greater than the switching voltage level. The gatexhi signal should be falling, or at its minimum, during the time period $t_2<t<t_3$ i.e. the period when both ml and cl are asserted. The signal denoted as h is asserted during this period. The gatexlo signal should be falling, or at its minimum, during the time period $t_1<t<t_4$ i.e. the period when either ml or cl is asserted. The signal denoted as l is asserted during this period. In the gate drive circuit, the signals h and l may be obtained using simple logic circuits and using control voltage levels.

A truth table showing operation of the corresponding logic circuit is given in Table 1. The inputs to the logic circuit are the digital switching signal, ml, and the output of the comparator, cl. Starting from the 'off' position, the signal l is asserted first and de-asserted last.

TABLE 1

| Condition | ml | cl | l<br>ml OR cl | h<br>ml AND cl |
|---|---|---|---|---|
| switch off | 0 | 0 | 0 | 0 |
| initial turn-on | 1 | 0 | 1 | 0 |
| switch on | 1 | 1 | 1 | 1 |
| initial turn-off | 0 | 1 | 1 | 0 |
| switch off | 0 | 0 | 0 | 0 |

Figure 5:
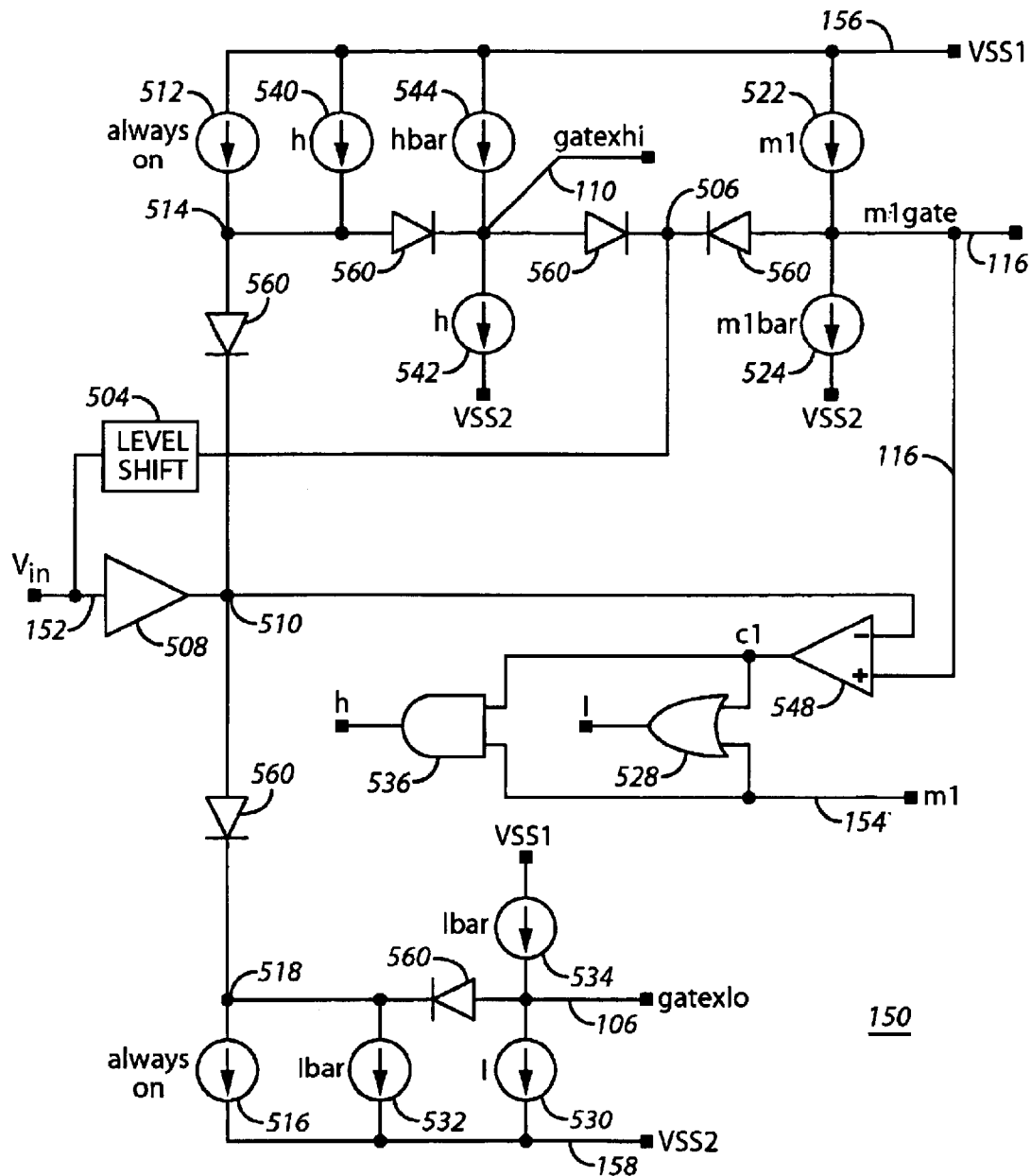
FIG. 5 is a schematic diagram of a gate-drive circuit in accordance with certain embodiments of the invention.

FIG. 5 is a schematic diagram of an exemplary gate driver circuit 150 used to generate the gate drive signals mlgate, gatexhi and gatexlo. The analog input signal Vin enters at input 152. A level shifter 504 provides a voltage level at node 506 that is approximately 9 V above the analog input signal level Vin. The analog input signal 152 is also coupled to unity gain buffer 508 to provide a buffered version of the analog input signal at node 510. An always-on current source 512 establishes a voltage at node 514, which is one diode drop above the analog input signal level. Another always-on current source 516, of equal value, establishes a voltage at node 518, which is one diode drop below the analog input signal level. The digital ml signal 154 controls the operation of current sources 522 and 524. When the digital ml signal is high, the ml current supply 522 is enabled and the mlbar current supply 524 is disabled. When the digital ml signal is low, the ml current supply 522 is disabled and the mlbar current supply 524 is enabled. Prior to the switch FET coming on, the digital ml signal 154 is low, hence the mlgate signal 116 is pulled to the bottom rail VSS2 by the mlbar current source 524 and the ml current source 522 is off. In one embodiment of the gate drive circuit 150, the current sources shown in FIG. 5 are provided by the output of FET current mirrors, and so behave light simple resistor pullups/pulldowns when the voltage across them falls below the level required to keep the output FET in saturation. The output signal l of the OR gate 528 controls the current sources 530, 532 and 534. When l is high the source 530 is on; when l is low the current sources 532 and 534 are on. With ml low and cl low, the signal l is low. Hence the l current source 530 is off and the lbar current sources 532 and 534 are on. This establishes the analog signal level Vin+Vth at the gatexlo output 106. The output signal h of the AND gate 536 controls the current sources 540, 542 and 544. When h is high the sources 540 and 542 are on, when h is low the current source 544 is on. Hence, with ml low, the output signal h of the AND gate 536 is also low. The h current sources 540 and 542 are off and the hbar current source 544 is on. This establishes a voltage level of Vs plus 9 V plus one diode drop on (i.e. the static turn-on level) of the gatexhi output 110.

A switch turn-on is initiated by the ml digital signal 154 going high. This turns off the mlbar current source 524 and turns on the ml current source 522, causing the mlgate signal 116 to ramp upward from the voltage level VSS2. The output l of the OR gate 528 goes high, turning on the l current source 530 and turning off the lbar current sources 532 and 534. This causes the gatexlo signal 106 to ramp downwards from the switching level Vs to the negative supply level VSS2. The output signal h of the AND gate 536 stays low until the level of the mlgate signal 116 exceeds the switching level Vs, at which time the output from comparator 548 switches. The signal h goes high, turning on the h current sources 540 and 542 and turning off the hbar current source 544. This causes the gatexhi signal 110 to ramp downwards from the turn-on level to the switching level Vs as the mlgate signal continues to ramp positively to the static turn-on level.

A switch turn-off is initiated by the ml digital signal 154 going low. This turns on the mlbar current source 524 and turns off the ml current source 522, causing the mlgate signal 116 to ramp downwards from the static turn-on level. The output signal h of the AND gate 536 goes low turning off the h current sources 540 and 542 and turning on the hbar current source 544. This causes the gatexhi signal 110 to ramp upwards from the switching voltage level Vs=Vin+Vth to the static turn-on level. The output l of the OR gate 528 stays high until the level of the mlgate signal 116 falls below the switching voltage level, at which time the output from comparator 548 switches. In one embodiment of the invention, this is achieved by setting a threshold of Vth in the comparator, so that the comparator switches when mlgate=Vin+Vth. The signal l then goes low, turning-off the l current source 530 and turning on the lbar current sources 532 and 534. This causes the gatexlo signal 106 to ramp upward from the negative supply level VSS2 to the switching voltage level as the signal mlgate continues to ramp negatively to VSS2.

The diodes 560 in FIG. 5 are used to block current flow in particular states of the circuit and to set voltage levels.

In an alternative embodiment of the gate drive circuit 150, the comparator 548 switches when mlgate=Vin. In this embodiment, the capacitor 112 in FIG. 1 can be used to correct for the error introduced by neglecting the threshold voltage Vth of the switching FET. This approach works well when the threshold voltage Vth is constant over the entire input signal range.

Figure 6:
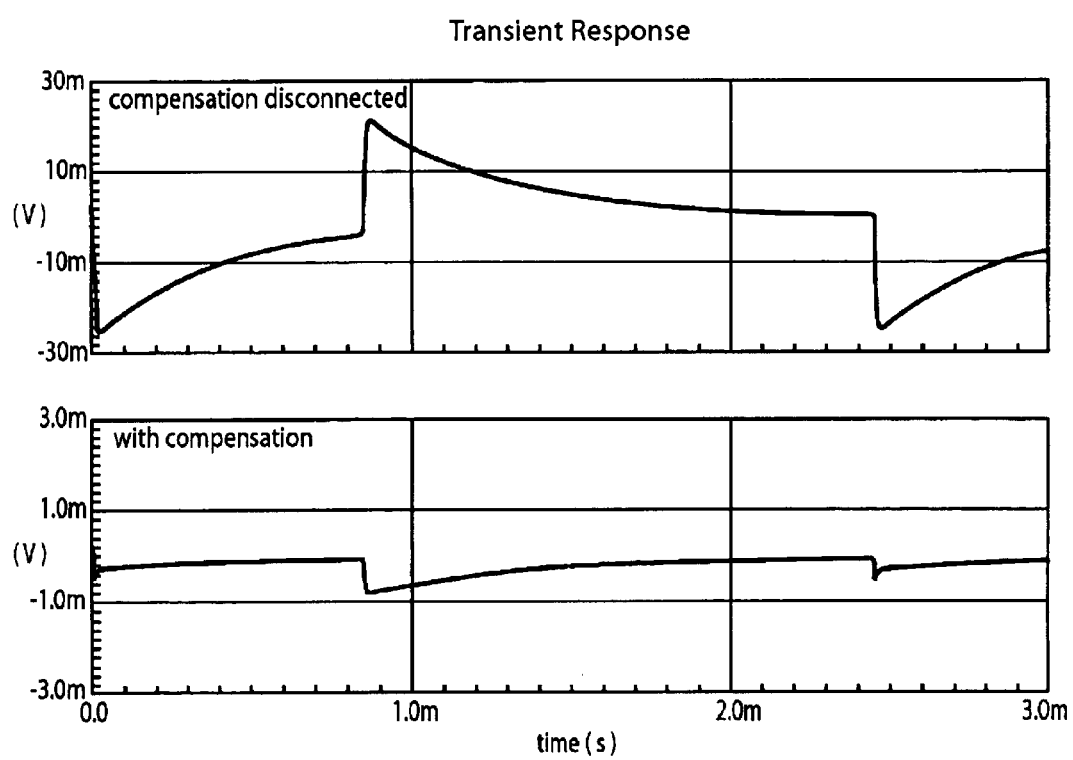
FIG. 6 is a graph showing reduction of charge injection by use of a charge compensation circuit.

FIG. 6 shows two graphs of "voltage transients" caused by charge injection in an N-channel enhancement mode MOSFET switch. The voltage is plotted as function of time. The upper graph shows the voltage due to charge injection without compensation. The peak voltage is approximately 25 mV. The lower graph shows the voltage when a charge compensation circuit is employed. The peak voltage is less than 1 mV.

Those of ordinary skill in the art will recognize that the present invention has been described in terms of exemplary embodiments based upon use of MOSFET devices, current sources and logic circuits. However, the invention should not be so limited, since the present invention could be implemented using hardware component equivalents.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A switching circuit with reduced charge injection comprising:
   an input node for receiving an analog input signal;
   a switch FET coupled to the input node and having an output for providing a switched signal, the switch FET being controlled by a first gate signal, mlgate;
   a first compensating FET coupled to the input node and controlled by a second gate signal, gatexlo;
   a second compensating FET coupled to the input node and controlled by a third gate signal, gatexhi, and
   a gate drive circuit responsive to the analog input signal and operable to produce the second and third gate signals.

2. A switching circuit in accordance with claim 1, wherein the switch FET comprises one or more MOSFET devices.

3. A switching circuit in accordance with claim 1, wherein the switch FET and the first and second compensating FETs are devices of the same kind.

4. A switching circuit in accordance with claim 1, wherein the gate-drain capacitance of the first compensating FET is coupled to the input node and the gate-drain, gate-to-source and gate-to-channel capacitances of the second compensating FET are coupled to the input node.

5. A switching circuit in accordance with claim 1, further comprising a tuning capacitor coupled across the drain and gate of the second compensating FET.

6. A switching circuit in accordance with claim 5, wherein the tuning capacitor has a variable capacitance.

7. A switching circuit in accordance with claim 1, wherein the second gate drive signal gatexlo and third gate drive signal gatexhi are related to the first gate drive signal mlgate and the analog input signal level Vin by:

$$gatexhi = Vs + Vbias + cl.(Vs - mlgate)$$

$$gatexlo = (1 - cl).(Vs - mlgate) + VSS2$$

where $$cl = \begin{cases} 1 & \text{if } mlgate > Vs \\ 0 & \text{otherwise} \end{cases},$$

Vs=Vin+Vth is a switching voltage level, Vth is a threshold voltage, VSS2 is a negative supply level and Vbias is a bias voltage level.

8. A switching circuit in accordance with claim 1, wherein the switch FET switches in response to a switching signal and wherein the gate drive circuit is responsive to the switching signal.

9. A switching circuit in accordance with claim 1, wherein the gate drive circuit comprises:
   a comparator for comparing the first gate signal and the analog input signal and producing a first logic signal;
   a logical OR circuit responsive to the first logic signal and the digital switching signal to produce a first control signal for controlling the second gate signal, and
   a logical AND circuit responsive to the first logic signal and a digital switching signal to produce a second control signal for controlling the third gate signal.

10. A switching circuit in accordance with claim 9, wherein the gate drive circuit further comprises:
    a level shifter for shifting the analog input signal to a higher voltage level;
    a plurality of first current sources controlled by the first control signal; and
    a plurality of second current sources controlled by the second control signal.

11. A switching circuit in accordance with claim 10, wherein the gate drive circuit further comprises a plurality of diodes for controlling the currents produced by the plurality of first current sources and the plurality of second current sources.

12. A switching circuit in accordance with claim 9, wherein the gate drive circuit further comprises a buffer for buffering the analog input signal before it is passed to the comparator.

13. A switching circuit in accordance with claim 9, wherein the gate drive circuit further comprises a plurality of third current sources controlled by the digital switching signal.

14. A switching circuit in accordance with claim 1, wherein at least one of the switch FET, the first compensating FET and the second compensating FET comprises a plurality of FET devices.

15. A method for switching an analog input signal received at an input node of a switch FET with reduced charge injection, the method comprising:
    supplying a gate drive signal to the switch FET;
    generating a gate drive signal for a first compensating FET coupled to the input node; and
    generating a gate drive signal for a second compensating FET coupled to the input node,
    wherein the gate drive signals for the first and second compensating FETs are dependent upon the analog input signal and gate drive signal to the switch FET.

16. A method in accordance with claim 15, further comprising receiving a switching signal and generating the gate drive signal for the switch FET in response to the switching signal.

17. A method in accordance with claim 16, further comprising:
    comparing the gate drive signal of the switch FET to the analog input signal;
    generating a first logic signal that it is asserted when the gate drive signal to the switch FET is greater than the analog input signal plus a threshold voltage OR the switching signal is asserted; and
    generating a second logic signal that it is asserted when the gate drive-signal to the switch FET is greater than the analog input signal plus a threshold voltage AND the switching signal is asserted,
    wherein the gate drive signal for the first compensating FET is dependent upon the first logic signal and the gate drive signal for the second compensating FET is dependent upon the second logic signal.

18. A method in accordance with claim 17, wherein the gate drive signal for the first compensating FET ramps downward from the level of the analog input signal plus a threshold voltage to a lower supply level when the first logic signal is asserted and ramps upward from the lower supply level to the level of the analog input signal plus a threshold voltage when the first logic signal is de-asserted.

19. A method in accordance with claim 17, wherein the gate drive signal for the second compensating FET ramps downward from a maximum gate drive level to the level of the analog input signal plus a threshold voltage when the second logic signal is asserted and ramps upward from the level of the analog input signal plus a threshold voltage to the maximum gate drive level when the second logic signal is de-asserted.

20. A method in accordance with claim 15, further comprising adjusting the capacitance of a capacitor coupled to the input node to minimize charge injection.

21. A method in accordance with claim 15, wherein the gate drive signal gatexlo for the first compensating FET and gate drive signal gatexhi for the second compensating FET are related to the gate drive signal mlgate for the switch FET and the analog input signal level Vin by:

$$gatexhi = Vs + Vbias + cl.(Vs - mlgate)$$

$$gatexlo = (1 - cl).(Vs - mlgate) + VSS2$$

where $$cl = \begin{cases} 1 & \text{if } mlgate > Vs \\ 0 & \text{otherwise} \end{cases},$$

Vs=Vin+Vth is a switching voltage level, Vth is a voltage threshold level, VSS2 is a negative supply level and Vbias is a bias voltage level.

22. A switching circuit comprising:
- a switch FET operable to make or break a connection between an input node and an output node in response to a first gate signal coupled to the gate of the switch FET;
- a first charge compensation means coupled to the input node and operable to compensate for charge injected by the switch FET when the voltage level of the first gate signal transitions between an off-level and a switching voltage level; and
- a second charge compensation means coupled to the input node and operable to compensate for charge injected by the switch FET when the voltage level of the first gate signal transitions between the switching voltage level and an on-level.

23. A switching circuit in accordance with claim 22, wherein the first and second charge compensation means are responsive to the switching voltage level and to the first gate signal.

24. A switching circuit in accordance with claim 22, wherein the first gate signal is generated in response to a digital switching signal and wherein the first and second charge compensation means are responsive to the switching voltage level and to the digital switching signal.

25. A switching circuit in accordance with claim 22, wherein the first charge compensation means comprises a second FET and the second charge compensation means comprises a third FET.

26. A switching circuit in accordance with claim 25, further comprising a gate drive circuit operable to generate a second gate signal gatexlo for controlling the second FET and a third gate signal gatexhi for controlling the third FET, wherein the gate drive circuit is responsive to switching voltage level.

27. A switching circuit in accordance with claim 26, wherein the second and third gate drive signals are related to the first gate drive signal mlgate and the switching voltage level Vs by $$gatexhi = 2*Vs+Vbias-mlgate$$

$$gatexlo = VSS2$$

when mlgate is greater than Vs, and by $$gatexhi = Vs+Vbias$$

$$gatexlo = Vs-mlgate+VSS2$$

otherwise, where VSS2 is a negative supply level.

28. A switching circuit in accordance with claim 22, wherein the switching voltage level Vs is related to the level Vin of an analog input signal supplied to the input node and a voltage threshold level Vth by Vs=Vin+Vth.

* * * * *